(12) United States Patent
Sip

(10) Patent No.: US 7,990,169 B2
(45) Date of Patent: Aug. 2, 2011

(54) ELECTRICAL TESTING DEVICE
(75) Inventor: Kim-Yeung Sip, Shenzhen (CN)
(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)
( * ) Notice: Subject to any disclaimer, the term of this patent is extended or adjusted under 35 U.S.C. 154(b) by 219 days.
(21) Appl. No.: 12/398,975
(22) Filed: Mar. 5, 2009
(65) Prior Publication Data
US 2010/0039101 A1 Feb. 18, 2010
(30) Foreign Application Priority Data
Aug. 13, 2008 (CN) .......................... 2008 1 0303720
(51) Int. Cl.
G01R 31/02 (2006.01)
G01R 31/28 (2006.01)
(52) U.S. Cl. .......... 324/756.05; 324/756.02; 324/762.01
(58) Field of Classification Search ............. 324/756.02; 439/169
See application file for complete search history.

(56) References Cited

U.S. PATENT DOCUMENTS

| 4,701,696 | A | * | 10/1987 | Bogardus et al. | ........ 324/754.07 |
| 4,924,179 | A | * | 5/1990 | Sherman | ................... 324/756.02 |
| 5,119,020 | A | * | 6/1992 | Massey et al. | ........... 324/755.01 |
| 5,994,894 | A | * | 11/1999 | Fujita | ....................... 324/756.02 |
| 6,348,789 | B1 | * | 2/2002 | Terao | ....................... 324/756.07 |

* cited by examiner

Primary Examiner — Jermele M Hollington
Assistant Examiner — Emily Y Chan
(74) Attorney, Agent, or Firm — Frank R. Niranjan

(57) ABSTRACT

An electrical testing device used for testing an electronic device under test. The electrical testing device includes a cable configured for receiving a test signal and transmitting the received test signal therethrough, and a testing unit connected to the cable and configured for analyzing the test signal. The cable includes a flexible body, a number of first connectors connected to an end of the flexible body configured for receiving a test signal from the electronic device under test, and a second connector connected to the other end of the flexible body configured for transmitting the test signal between the flexible body and the testing unit.

5 Claims, 3 Drawing Sheets

ELECTRICAL TESTING DEVICE

TECHNICAL FIELD

The present disclosure generally relates to an electrical testing device.

BACKGROUND

Most electrical testing devices includes a testing unit and a cable. One end of the cable is connected to the testing unit and the other end of the cable is connected to the electronic device under test. Because the electrical testing device will be used for testing a great number of electronic devices, the cable must be plugged into and unplugged from the electronic devices to be tested and this will tend to wear out the cable connector.

What is needed, therefore, is an electrical testing device to overcome the above mentioned problems.

DETAILED DESCRIPTION OF THE EMBODIMENTS

Figure 1:
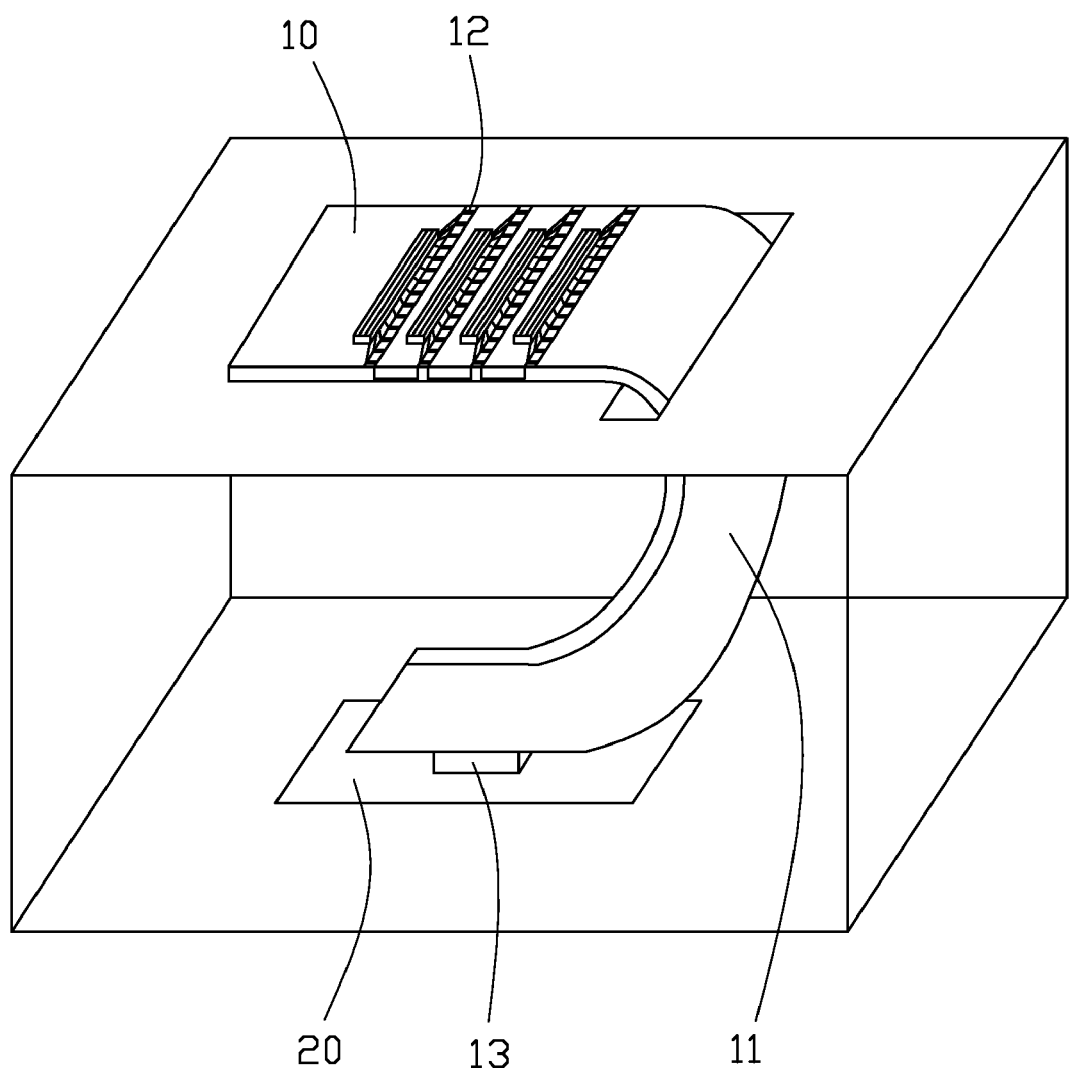
FIG. 1 is a schematic view of an electrical testing device according to an exemplary embodiment.
Figure 2:
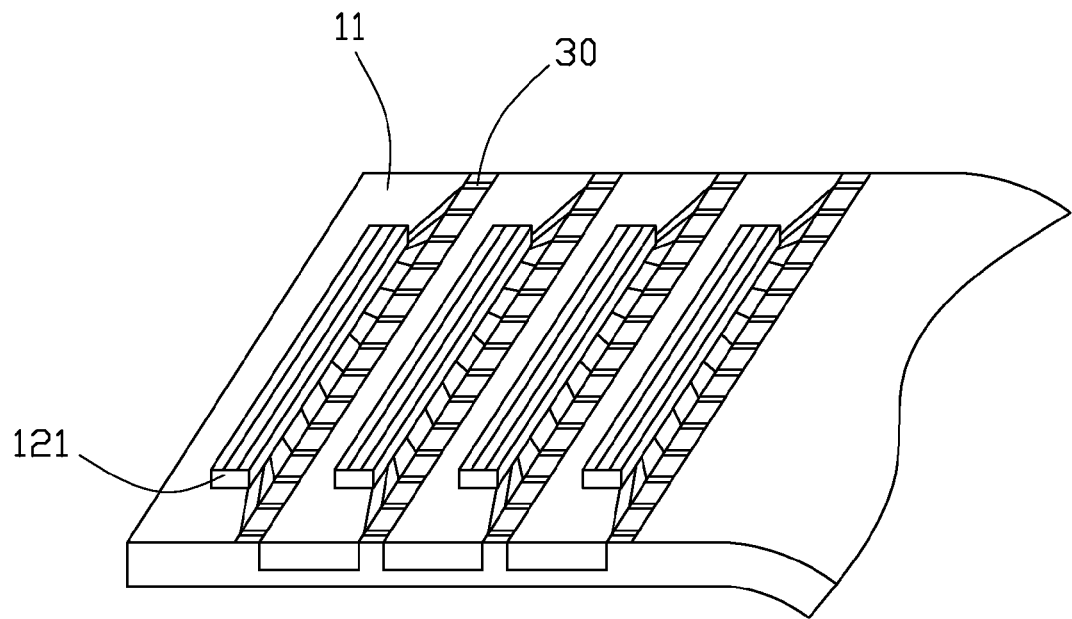
FIG. 2 is an enlarged view of a portion of the electrical testing device of FIG. 1.

Referring to FIG. 1, an electrical testing device 100, according to an exemplary embodiment, is shown. The electrical testing device 100 is used for testing electronic devices (not shown). The electrical testing device 100 includes a cable 10 and a testing unit 20. The testing unit 20 is connected to an end of the cable. The cable 10 is configured for receiving a test signal from the electronic device under test and transmitting the received test signal to the testing unit 20. The testing unit 20 is configured for analyzing the test signal and generating a test result according to the test signal.

The cable 10 includes a flexible body 11, a number of first connectors 12, and a second connector 13. The first connectors 12 are connected to one end of the flexible body 11. The second connector 13 is connected to the other end of the flexible body 10 and configured for transmitting the test signal between flexible body 11 and the testing unit 20. The first connectors 12 are configured for electrically connecting to the electronic device under test for receiving the test signal from the electronic device under test. The second connector 13 is coupled with the testing unit 20. The flexible body 11 is configured for transmitting the received test signal to the testing unit 20 through the second connector 13.

The testing unit 20 typically includes a processing unit (not shown) for analyzing test signals.

Figure 3:
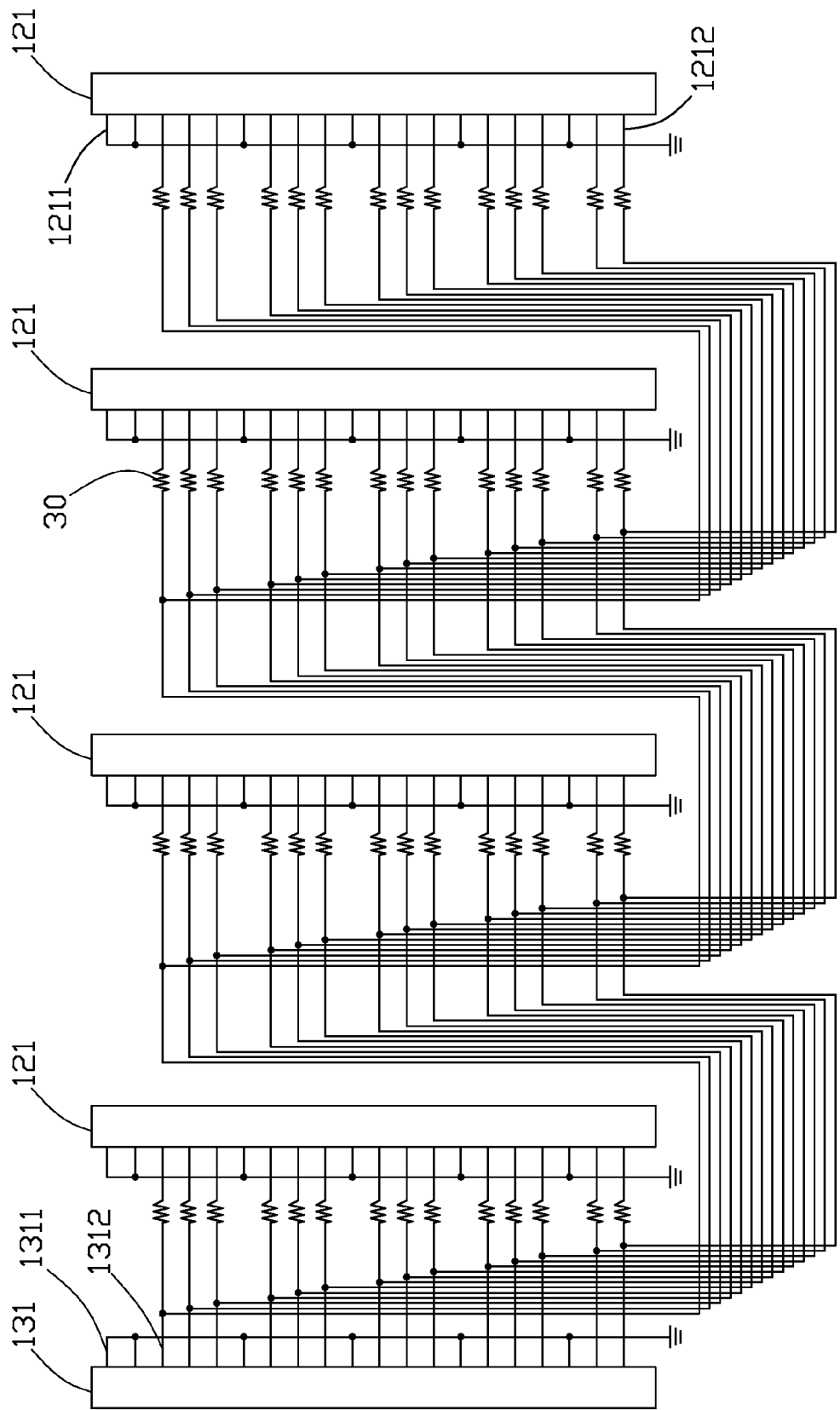
FIG. 3 is a circuit diagram between a first socket and a second socket of the electrical testing device of FIG. 1.

Referring to FIG. 3, each of the first connectors 12 defines a first socket 121 for receiving a plug of the electronic device (not shown) to be tested. The second connector 13 defines a second socket 131, electrically connected to the first sockets 121, for receiving a plug (not shown) of the testing unit 20.

Each of the first sockets 121 includes at least one (six in this embodiment) first grounding end 1211 and a number of first connecting ends 1212. The second socket 13 includes at least one (also six in this embodiment) second grounding end 1311 and a number of second connecting ends 1312. The first grounding end 1211 and the second grounding end 1311 are connected to ground to shunt unwanted voltages due to electromagnetic interference (EMI) signals. Each of the second connecting ends 1312 is electrically connected to a corresponding first connecting end 1212 of the first connector 12 via a resistor 30. Each of the resistors 30 can be a rheostat for ease of adjusting resistance between the connecting ends 1212, 1312.

The flexible body 11 is a flexible printed circuit (FPC) cable, which is capable of transmitting the test signal therethrough.

In testing, the electronic device under test may send a high frequency signal to the testing unit 20 via the cable 10. When a high-frequency electrical signal travels from one resistive junction to another non-matching resistive junction, the mismatch resistance may cause signal reflection. The signal reflection may causes signal distortion, which in turn will result in communication errors. The solution to this problem is to match the impedance at each junction. If the test signal of the electrical object is at a high frequency (about 3 MHZ to 30 MHZ), it is necessary to adjust the resistance of the resistors 30 to a suitable level, if the test signal of the electrical object is at a low frequency (about 30 KHZ to less than 3 MHZ), the signal reflection will minimal, if any, and the resistance of resistors can be adjusted to 0Ω.

In practice, the electronic device under test is connected to one of the first connectors 12, if this first connector 12 is broken by frequent plugging/unplugging operations or any other reason, the electronic device under test can be connected to another first connector 12 which is in good condition. Therefore, the cable 10 with the first connector 12 can be used for a longer time.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An electrical testing device for testing an electronic device, the electrical testing device comprising:
   a cable configured for receiving a test signal and transmitting the received test signal therethrough, the cable comprising:
      a plurality of first connectors connected to the electronic device under test and configured for receiving a test signal from the electronic device under test, each of the first connectors defining a first socket, the first sockets each comprising a plurality of first connecting ends;
      a flexible body with one end connecting to the first connectors configured for transmitting the received test signal; and
      a second connector connected to the other end of the flexible body, the second connector defining a second socket electrically connected to the first sockets, the second socket comprising a plurality of second connecting ends corresponding to the first connecting ends of each first socket, each of the second connecting ends being electrically connected to a corresponding first connecting end of each first socket; and
   a testing unit coupled with the second connector of the cable and configured for analyzing test signals.

2. The electrical testing device as claimed in claim 1, wherein the flexible body is a flexible printed circuit (FPC) cable.

3. The electrical testing device as claimed in claim 1, wherein the first sockets each further comprises at least one first grounding end, and the second socket further comprises at least one second grounding end, the first grounding end and the at least one second grounding end being connected to ground.

4. The electrical testing device as claimed in claim 3, wherein each of the second connecting ends is electrically connected to a corresponding first connecting end of the first connector via a resistor.

5. The electrical testing device as claimed in claim 4, wherein the resistor is a rheostat.

* * * * *